(12) United States Patent
Griswold et al.

(10) Patent No.: US 7,132,827 B2
(45) Date of Patent: Nov. 7, 2006

(54) MAGNETIC RESONANCE IMAGING METHOD USING A PARTIAL PARALLEL ACQUISITION TECHNIQUE WITH NON-CARTESIAN OCCUPATION OF K-SPACE

(75) Inventors: Mark Griswold, Kitzingen (DE); Robin Heidemann, Waldbrunn (DE); Gunnar Krüger, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1 day.

(21) Appl. No.: 11/126,690

(22) Filed: May 11, 2005

(65) Prior Publication Data
US 2005/0264287 A1    Dec. 1, 2005

(30) Foreign Application Priority Data
May 14, 2004    (DE)    ............... 10 2004 024 459

(51) Int. Cl.
*G01V 3/00*    (2006.01)
(52) U.S. Cl. ..................... 324/309; 324/307
(58) Field of Classification Search ............... 324/309, 324/307
See application file for complete search history.

(56) References Cited

U.S. PATENT DOCUMENTS 4,727,325 A * 2/1988 Matsui et al. ............... 324/309
6,486,670 B1 * 11/2002 Heid ........................... 324/307
6,841,998 B1   1/2005 Griswold
7,042,215 B1 * 5/2006 Moriguchi et al. .......... 324/307

OTHER PUBLICATIONS

"Advances in Sensitivity Encoding With Arbitrary k-Space Trajectories," Pruessmann et al., Magnetic Resonance in Medicine, vol. 46 (2001), pp. 638-651.

* cited by examiner

*Primary Examiner*—Louis M. Arana
(74) *Attorney, Agent, or Firm*—Schiff Hardin LLP

(57) ABSTRACT

In a method for magnetic resonance imaging using a partial parallel acquisition technique with a non-Cartesian occupation of k-space, a number of antennas disposed around an imaging volume for reception of magnetic resonance signals and the magnetic resonance signals in the imaging volume are spatially coded by magnetic gradient fields, such that k-space for each antenna is only incompletely occupied with magnetic resonance signals with at least one trajectory proceeding around the origin of k-space. From the reception signals of each antenna, missing sample values of the trajectory that lie on a straight-line segment extending from the origin are determined in k-space according to a weighting with weighting factors from sample values of the trajectory that likewise lie on the straight lines, such that each k-space is completely occupied. A partial image of the imaging area is generated from each completely occupied k-space by means of a Fourier transformation. An image of the imaging volume is generated from the partial images.

11 Claims, 4 Drawing Sheets

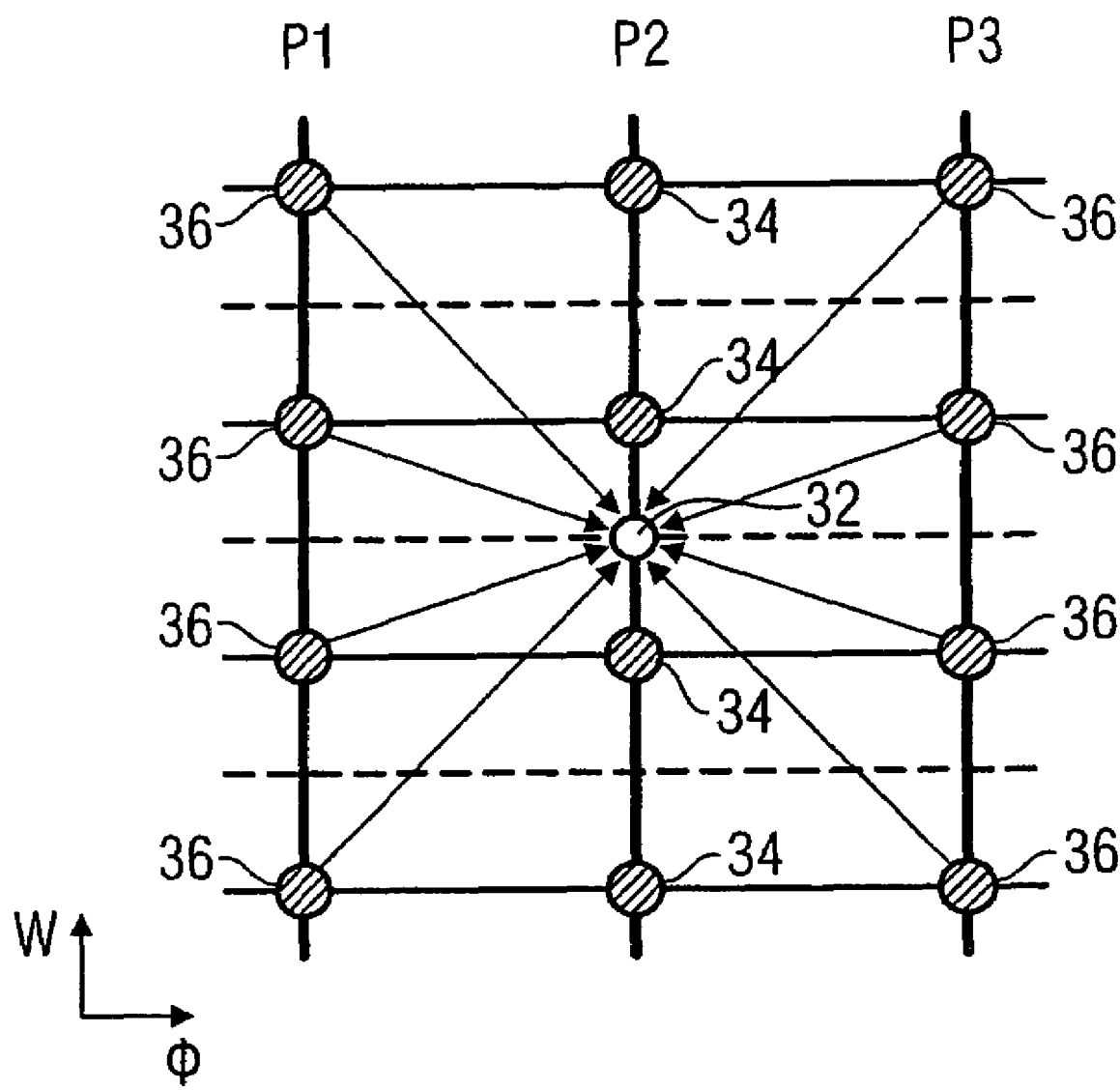

MAGNETIC RESONANCE IMAGING METHOD USING A PARTIAL PARALLEL ACQUISITION TECHNIQUE WITH NON-CARTESIAN OCCUPATION OF K-SPACE

BACKGROUND OF THE INVENTION

1. Field of the Invention

The present invention concerns a method for magnetic resonance imaging using a partial parallel acquisition technique with non-Cartesian occupation of k-space, with a number of antennas disposed around an imaging volume for reception of magnetic resonance signals, and with spatial coding of the magnetic resonance signals in the imaging volume by means of magnetic gradient fields such that k-space is only incompletely occupied with magnetic resonance signals, with at least one trajectory proceeding around the origin of k-space.

2. Description of the Prior Art

A method of the above-described type is known from the article by Pruessmanet al. "Advances in Sensitivity Encoding with Arbitrary k-Space Trajectories", in Magnetic Resonance in Medicine, Vol. 46, pages 638-651, 2001. For magnetic resonance imaging using a partial parallel acquisition technique, the reception signals from a number of antennas disposed around an examination volume are further processed into a image of the imaging volume that is free of aliasing artifacts. In the SENSE method, an aliasing-free reconstruction ensues from individual images of the reception antennas, even though the individual images themselves exhibit aliasing foldings. This is accomplished by k-space not being occupied by the reception signals of the individual antennas, i.e., it is under-scanned. The method specified in the artifacts for reconstruction that is free of aliasing artifacts allows k-space to be occupied with the reception signals along arbitrary trajectories, in particular along spiral trajectories. Spiral trajectories are used in neuro-imaging and cardio-imaging. The k-space trajectories are determined by the magnetic gradient fields used for spatial coding. The reconstruction effort, however, is computationally intensive in this known method.

Because of the non-Cartesian k-space occupation, the artifact behavior is reduced. For example, artifacts known as "blurring" artifacts and fluctuations of physiological parameters (physiological noise) are thereby reduced. This method is additionally less susceptible to deficiencies of the apparatus (such as, for example, inhomogeneities).

A method involving a different partial parallel imaging technique is know from German OS 101 26 078. In that method (as in the SENSE technique) reception signals are acquired by a number of antennas and are sorted into respective k-space associated with the antennas. The k-spaces are again incompletely occupied. In contrast to the SENSE method, however, missing sample points in each scanned k-space are determined from existing sample values with usage of a previously-determined weighting matrix. Such methods belong to the SMASH family and are known under the designations SMASH, AUTO-SMASH, VD-AUTO-SMASH and GRAPPA. Partial images that are then processed into an overall image of the imaging volume are then generated from completed k-spaces of the individual antenna signals by means of respective Fourier transformations. The method is described for a Cartesian occupation of k-space.

SUMMARY OF THE INVENTION

An object of the present invention is to provide a method for magnetic resonance imaging using a partial parallel acquisition technique with non-Cartesian occupation of k-space, in which method the reconstruction effort is not excessive.

This object is achieved in accordance with the invention by a method of the type initially described wherein, in each k-space for reception signals from each antenna, missing sample values lying on a straight line from the origin are determined from sample values of the trajectory likewise lying on the straight line after a weighting with weighting factors, such that each k-space is completely occupied. A partial image of the imaging area is generated from each completely occupied k-space by means of Fourier transformation. An image of the imaging area is generated from the partial images. The reconstruction times for non-Cartesian partial parallel imaging in the inventive method are significantly decreased compared to the previously-described method. Simulations and reconstructions with Matlab programs show a reduction of the reconstruction times by a factor of 10 to 100. Partial parallel imaging with non-Cartesian scanning is practical for clinical magnetic resonance imaging only with such significantly reduced reconstruction times.

In general, the sample values are arranged densely on the trajectory such that, with a sufficiently small error, the next sample value at the intersection of straight line and trajectory can be used to determine the missing sample values. If the precision should be increased, in an embodiment interpolated sample values, that respectively lie precisely at the intersection point of the straight line with the trajectory, are inserted between the sample values on the trajectory.

In a further embodiment, the trajectory curve is an Archimedean spiral. The Archimedean spiral allows a symmetrical arrangement of the sample points on the trajectory and therewith a simple reconstruction of the missing sample values.

In another embodiment, the trajectory proceeds in loops around the origin and the sample values are resorted into a pseudo-Cartesian k-space such that sample values belonging to the individual loops are associated with the individual straight lines dependent on the angle. The pseudo-Cartesian k-space (or hybrid space) is spanned by the angle of the straight line and by the loop number. This resorting of the k-space values in the hybrid space allows the data to be directly subjected to a normal known reconstruction, for example GRAPPA reconstruction. The radial separation of the sample values, which changes in the course of a loop, is no longer taken into account; but the error that arises is negligible.

In a further embodiment, sample values of directly adjacent straight lines are also used to improve the precision of the reconstruction of the missing sample values.

After the reconstruction of the missing sample values (and filling of the hybrid space), a partial image associated with the corresponding antenna can be generated by means of a polar Fourier transformation. In an embodiment of the invention the sample values (including the reconstructed sample values) are transformed from the hybrid space back into Cartesian k-space. The partial images are then generated by a fast Fourier transformation technique. The widely used fast Fourier transformation technique thus can also be used with spiral trajectories.

DESCRIPTION OF THE DRAWINGS

FIG. 6 shows a section from hybrid space with representation of the existing sample values used for reconstruction.

DESCRIPTION OF THE PREFERRED EMBODIMENTS

Figure 1:
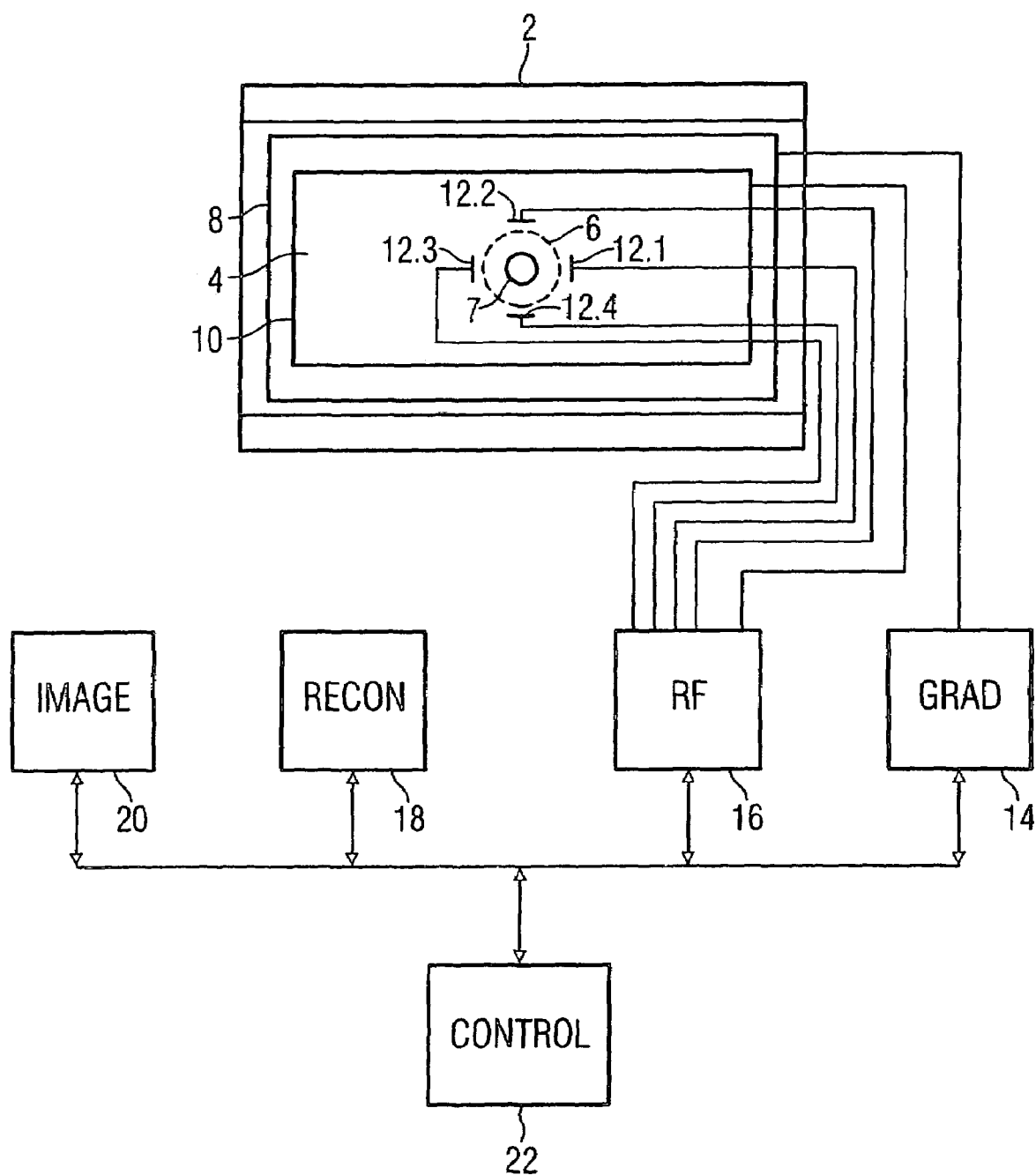
FIG. 1 is a block diagram of a diagnostic magnetic resonance apparatus for implementation of an embodiment of the inventive method.

FIG. 1 shows the basic components of a diagnostic magnetic resonance apparatus designed to implement an exemplary embodiment of the invention. The magnetic resonance apparatus has a basic field magnet 2 that generates a homogeneous magnetic field in a cylindrical patient space 4 in a spherical imaging volume 6. An imaging volume 7 of a patient is situated within this imaging volume 6 for data acquisition therefrom. The basic magnetic field is aligned parallel to the longitudinal axis of the cylindrical patient space 4. A gradient system 8 is provided for spatial coding of magnetic resonance signals excited for imaging the gradient system 8 generates linear gradient fields in the imaging volume 6 in three directions perpendicular to one another, these linear gradient fields being superimposed on the basic magnetic field. The gradient system 8 essentially is formed by three coil pairs for generation of the gradient fields in the x-, y- and z-directions, the z-direction usually coinciding with the longitudinal axis of the patient space 4. A radio-frequency antenna 10 designed both for excitation and for reception of the magnetic resonance signals is disposed in the cylindrical inner space 4 for generation of the magnetic resonance signals. Since the inner space of the radio-frequency antenna 10 large enough to accept the patient, this antenna 10 is known as a whole-body antenna. Local antennas 12.1, 12.2, 12.3, 12.4 that are adapted for examinations of limited regions, for example the head, are provided in addition to the radio-frequency antenna 10.

The gradient system 8 is connected to a gradient controller 14 that supplies current necessary for generation of the gradient fields. The antennas 10 and 12.1 through 12.4 are connected to a radio-frequency system 16 that supplies the radio-frequency power necessary for excitation of the magnetic resonance signals in the human body, prepares and processes the very weak magnetic resonance signals from the human body. The received signals are amplified, filtered and then digitized. A reconstruction unit 18 reconstructs an image of the examination area 7 from the digitized magnetic resonance signals by means of a Fourier transformation, with the gradient signals used for spatial coding being likewise used. The reconstructed image is shown at an image display unit 20, possibly after image processing. The entire process for image generation is set by a control unit 22 according to corresponding inputs by a user.

The fundamental idea in partial parallel imaging is to reduce the time necessary for the data acquisition and thereby to shorten the imaging time, by generating only an incomplete data set of magnetic resonance signals. An image free of aliasing artifacts cannot be generated from such raw data sets without further measures. Aliasing in the image can be prevented when a number of reception antennas 12.1, 12.2, 12.3, 12.4 with different sensitivity profiles are used for simultaneous reception of the magnetic resonance signals. The data sets thereby acquired are processed unto an image free of aliasing using sensitivity profiles. Such methods are described in detail in German OS. 101 26 078 cited above, but for a Cartesian occupation of k-space. In the present situation, however, k-space is occupied along trajectories proceeding in a non-Cartesian manner.

Figure 3:
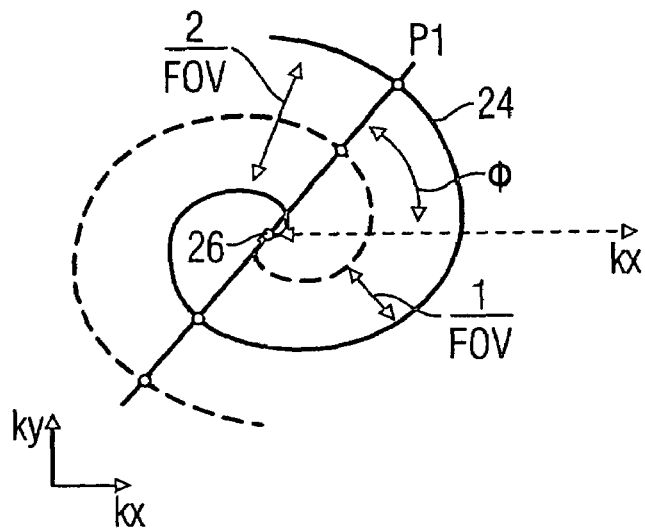
FIG. 3 shows the basic curve of a spiral trajectory in k-space.

FIG. 3 shows a spiral k-space trajectory 24 that, starting from the origin 26 of k-space, proceeds around this origin 26 in a number of loops with growing separation. Here the curve of the trajectory 24 corresponds to that of an Archimedean ("constant angular velocity") spiral. The number of the data points per loop is then constant. Spatial coding along spiral trajectories is generally known, so a detailed explanation is not necessary. In principle, in addition to this two gradient fields perpendicular to one another are generated by the gradient system 14 with a sinusoidal current or and a cosinusoidal current, respectively, with the amplitude additionally linearly increasing with time. The increase in the amplitude is so steep or rises so quickly that the individual loops of the spiral-shaped trajectory exhibit a separation so large that under-sampling in k-space occurs.

In FIG. 3, only the beginning of the spiral trajectory 24 is shown. In the exemplary embodiment the trajectory actually contains 32 windings around the origin 26. The separation of the individual windings from one another is so large that only a part of k-space can be occupied with sample values. Given a complete occupation of k-space, or given a complete sampling, at maximum a separation of 1/FOV of the individual windings relative to one another may be present (FOV being the maximum measurement of the imaging field 7 to be represented). As an example, the doubled interval 2/FOV with which k-space is occupied overall with only half of the necessary sample values is shown in FIG. 3. It is thereby advantageous that the image acquisition time is thus halved.

Figure 2:
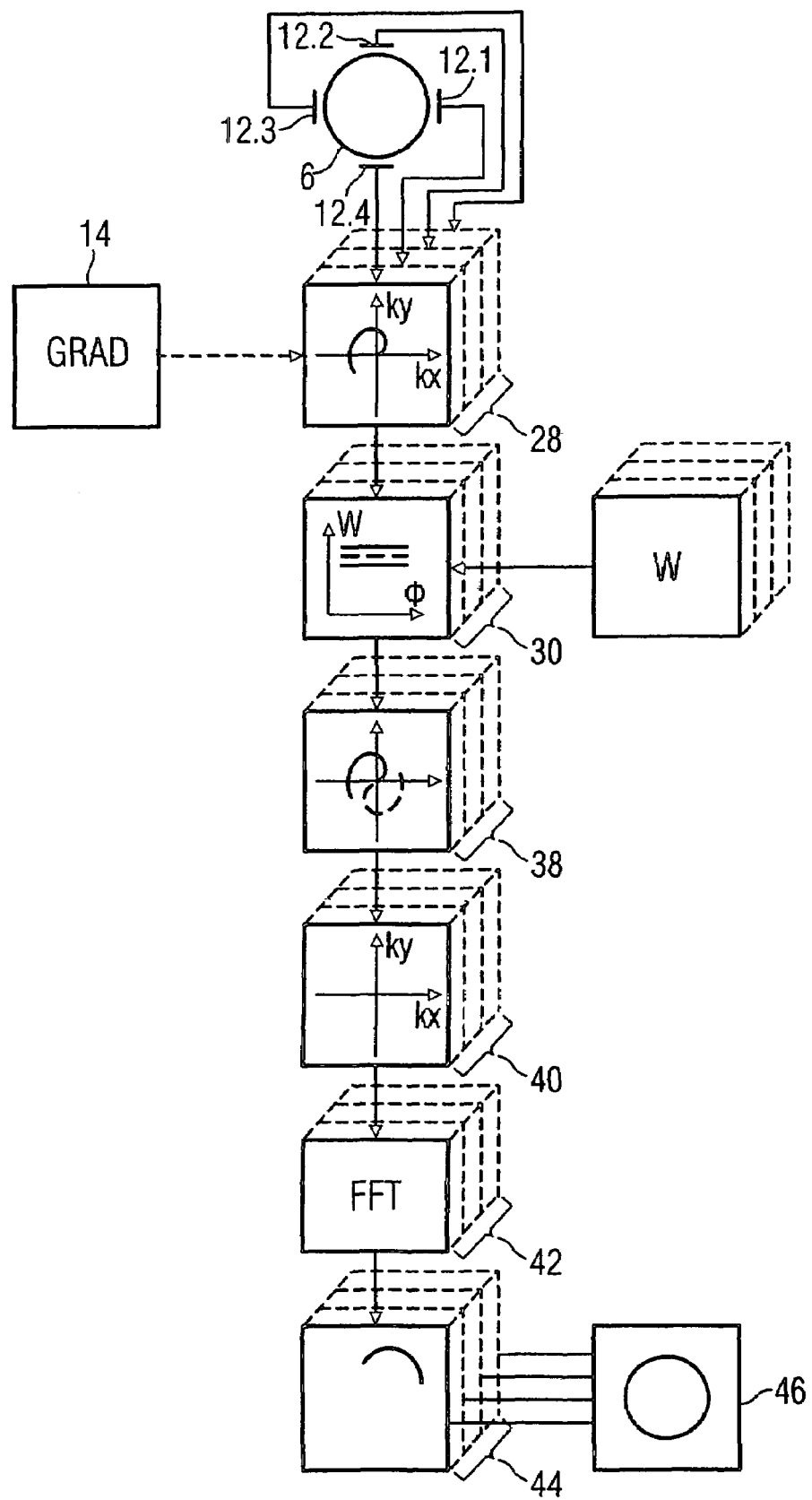
FIG. 2 shows the basic steps of an embodiment of the inventive method.

As illustrated in FIG. 2, the reception signals of the individual antennas 12.1 through 12.4 are entered into a corresponding k-space matrix. This is symbolized by the method step 28 in FIG. 2. For clarity, in FIG. 2 the symbols for the individual method steps are indicated only in a simple manner, but the signal processing ensues in separate signal processing channels, respectively proceeding from the antenna signals.

The sample values from k-space are resorted into hybrid space 30 in method step 30. This is shown in FIG. 3. Hybrid space 30 is defined by an angle φ as an abscissa that forms a straight-line segment P1 with, for example the $k_x$-axis of k-space, starting from the origin 26. The loop number indicates the ordinate. This resorting ensues individually for each data set originating from the local antennas 12 through 12.4.

Figure 4:
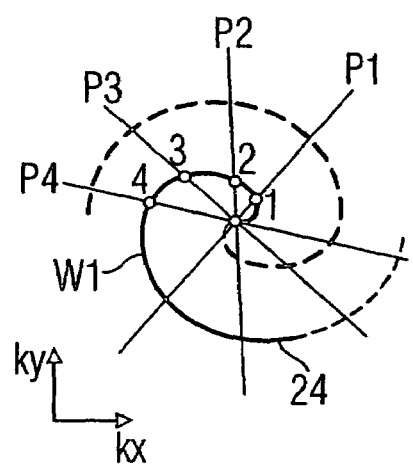
FIG. 4 shows the curve of a spiral trajectory in k-space with straight-line segments emanating from the origin.
Figure 5:
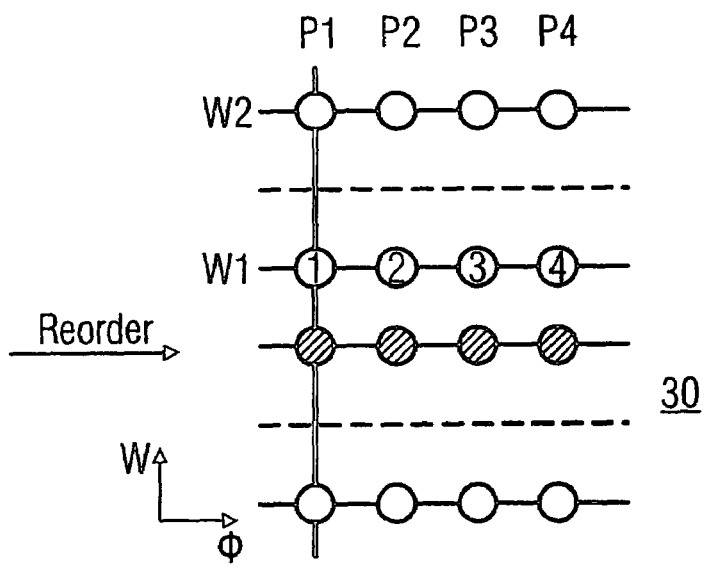
FIG. 5 shows a section of hybrid space wherein the sample values from k-space are resorted and missing sample values are determined.

FIGS. 4 and 5 explain the principle of the resorting again in more detail. Starting from the straight-line segments P1 through P4 that respectively exhibit an identical angular separation relative to the adjacent straight-line segments, the sample values that lie at the intersection points of the straight-line segment P1 through P4 with the trajectory are sorted into the hybrid space for each loop. The first four sample values 1 through 4 on the loop W1 are designated in FIG. 5 as examples. The separation of the straight-line segments from one another is here shown enlarged for reasons of clarity; the intervals of the straight-line segments relative to one another actually amount to approximately 1 degree. Approximately 360 sample points therewith result per loop, and given 32 loops approximately 12,000 sample values result for the entire trajectory 24.

In general, the sample values do not lie precisely on the intersection points of the straight-line segments P1 through P4 with the trajectory 24. Given a sufficiently dense occupation the next sample value is then taken, but a value is also interpolated to increase the precision.

The reconstruction of missing sample values is explained using FIG. 6. Since the sample values are again arranged in a Cartesian manner in hybrid space 30, they can used for reconstruction in a manner analogous to the known GRAPPA method. To determine a missing sample value 32, for example on the straight-line segment P2, the GRAPPA reconstruction uses known sample values 34 adjacent to the missing sample value 34 on the straight-line segment P2 and, if applicable, additional known and adjacent sample values 36 on the adjacent straight-line segments P1 and P3. These segment values are used for reconstruction after weighting with a previously-determined weighting factor W.

The weighting factors necessary for the GRAPPA reconstruction are determined from an adjustment scan implemented before the actual imaging sequence, in which k-space is completely occupied at least in a region around the origin 26. This method for determination of the weighting factors is particular suitable when an image series is to be generated. An adjustment scan for determination of the weighting factors is then implemented once before the start of the data acquisition for the image series.

In order to increase the precision of the reconstruction of the missing sample values 32, the weighting factors W can be separately determined for segments of k-space. The adjustment scan must then lead to a complete occupation with sample values for the corresponding segments.

The weighting factors W alternatively can be determined with a technique known as an auto-calibration. No adjustment is thus necessary beforehand. The principle is to effect a complete scan in central k-space and to reduce the sample density only in the outer regions of k-space. A completely scanned central region thus exists in k-space, but the resolution is correspondingly low. This information nevertheless is sufficient to determine the weighting factors W necessary for the reconstruction of the missing sample values 32. The trajectory 24 is additionally designed in the central k-space region such that a complete k-space coverage is achieved. The distance between the spiral arms or spiral loops is then increased at a specific distance from the origin 26, such that an under-sampling exists in outer k-space.

Referring again to FIG. 2, a transformation back into Cartesian k-space, which is now completely occupied, ensues in method step 38 after the reconstruction of the missing sample values in the hybrid space 30. Since the sample values do not exist on non-Cartesian trajectories, a procedure known as "re-gridding" of the sample values on a Cartesian grid now ensues in k-space in a further method step 40. A Fourier transformation that provides the partial images 44 of the imaging region 7 ensues in method step 42 for each data set of the local antennas 12.1 through 12.4. In a last step 46, these partial images are superimposed info an overall image, for example with a pixel-by-pixel summation of the squared image values of the individual partial images 44.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for magnetic resonance imaging comprising the steps of:

in a partial parallel acquisition technique, acquiring magnetic resonance signals from a subject with a plurality of antennas respectively disposed at different locations relative to an imaging volume of the subject, and spatially coding said magnetic resonance signals with at least one magnetic gradient field, each of said antennas having a k-space associated therewith;

in each k-space, entering the magnetic resonance signals received by the antenna associated therewith in a trajectory proceeding around an origin of that k-space to produce an incomplete, non-Cartesian occupation of that k-space with said magnetic resonance signals;

for each k-space, completing occupation thereof by electronically determining, in a computer, values absent from said trajectory that lie on a straight-line segment extending from said origin, by weighting, with a weighting factor, sample values existing on the trajectory that also lie on said straight line, to obtain a completely occupied k-space;

Fourier transforming each completely occupied k-space to produce a partial image, thereby obtaining a plurality of partial images; and reconstructing an image of said imaging area from said plurality of partial images.

2. A method as claimed in claim 1 comprising, in said computer, interpolating sample values that lie at an intersection of said straight-line segment and said trajectory, and inserting said interpolated sample values between the sample values on the trajectory.

3. A method as claimed in claim 1 comprising, in each k-space, entering said magnetic resonance signals on a trajectory proceeding in a spiral around said origin.

4. A method as claimed in claim 3 comprising, in each k-space, entering said magnetic resonance signals on a trajectory following an Archimedean spiral around said origin.

5. A method as claimed in claim 1 comprising, in each k-space, identifying a plurality of straight-line segments extending from the origin for completing occupation of that k-space, said straight lines being disposed at equidistant angles relative to each other.

6. A method as claimed in claim 1 comprising, in each k-space, entering said magnetic resonance signals in a spiral trajectory proceeding in a plurality of loops around the origin, and completing occupation of that k-space using a plurality of straight-line segments extending from the origin through said loops, and re-sorting sample values on said trajectory into a pseudo-Cartesian hybrid space dependent on an angle that the respective straight-line segments make with respective loops.

7. A method as claimed in claim 6 comprising, in each k-space, re-sorting the sample values in that k-space including sample values determined to complete occupation of that k-space, back into a Cartesian k-space, and generating the partial image from that Cartesian k-space by a fast Fourier transformation technique.

8. A method as claimed in claim 1 comprising, in each k-space, completing occupation of that k-space using a plurality of straight-line segments extending from the origin, and determining a missing sample value on one of said straight-line segments, from existing sample values on said trajectory intersected by straight-line segments adjacent to said one of said straight-line segments.

9. A method as claimed in claim 1 comprising in each k-space, organizing said trajectory in a region around the origin with a density allowing generation, from that k-space, of a low-resolution partial image that is free of aliasing artifacts, and determining said weighting factors from sample values of said magnetic resonance signals in said region.

10. A method as claimed in claim 1 comprising obtaining data from a pre-scan of the subject before said partial parallel acquisition technique, and determining said weighting factors from the data obtained in said pre-scan so that each k-space is completely occupied at least in a region around the origin thereof.

11. A method as claimed in claim comprising individually segmenting each k-space into a plurality of individual segments and, within each individual segment, determining sample values to complete occupation of that individual segment using weighting factors associated with that individual segment.

* * * * *